(12) United States Patent
Ootori

(10) Patent No.: US 11,751,364 B2
(45) Date of Patent: Sep. 5, 2023

(54) ELECTRONIC EQUIPMENT

(71) Applicant: Sony Interactive Entertainment Inc., Tokyo (JP)

(72) Inventor: Yasuhiro Ootori, Kanagawa (JP)

(73) Assignee: Sony Interactive Entertainment Inc., Tokyo (JP)

( * ) Notice: Subject to any disclaimer, the term of this patent is extended or adjusted under 35 U.S.C. 154(b) by 179 days.

(21) Appl. No.: 17/296,313

(22) PCT Filed: Nov. 29, 2019

(86) PCT No.: PCT/JP2019/046911
§ 371 (c)(1),
(2) Date: May 24, 2021

(87) PCT Pub. No.: WO2020/111274
PCT Pub. Date: Jun. 4, 2020

(65) Prior Publication Data
US 2022/0046829 A1    Feb. 10, 2022

(30) Foreign Application Priority Data

Nov. 30, 2018  (JP) ................................. 2018-225447

(51) Int. Cl.
*H05K 7/20*    (2006.01)
(52) U.S. Cl.
CPC ......... *H05K 7/20909* (2013.01); *H05K 7/209* (2013.01)

(58) Field of Classification Search
CPC ............... H05K 7/20909; H05K 7/209; H05K 7/20163; H05K 7/20181; H05K 7/20727;
(Continued)

(56) References Cited

U.S. PATENT DOCUMENTS 8,228,671 B2   7/2012   Ikeda
8,817,470 B2   8/2014   Aoki
(Continued)

FOREIGN PATENT DOCUMENTS

JP    54086769 A    7/1979
JP    63022791 U    2/1988
(Continued)

OTHER PUBLICATIONS

Reasons of Refusal for corresponding JP Application No. 2020-557885, 9 pages, dated May 31, 2022.
(Continued)

*Primary Examiner* — Mandeep S Buttar
*Assistant Examiner* — Yahya Ahmad
(74) *Attorney, Agent, or Firm* — Matthew B. Dernier, Esq.

(57) ABSTRACT

Electronic equipment (10) has multiple cooling fans (15) for sending air to a heat sink (30). The multiple cooling fans (15) generate airflow (Fh) passing through the heat sink (30) from a first side (H1) to a second side (H2) thereof. The heat sink (30) is arranged obliquely to a crosswise direction and a longitudinal direction of the electronic equipment (10). A sheathing member (40) has an air inlet opening (41*i*) formed obliquely to the crosswise and longitudinal directions along the first side (H1) of the heat sink (30).

24 Claims, 10 Drawing Sheets

(58) Field of Classification Search
CPC ..... H05K 7/20136; H01L 23/467; G06F 1/20; G06F 1/203
See application file for complete search history.

(56) References Cited

U.S. PATENT DOCUMENTS

| | | | | |
|---|---|---|---|---|
| 10,512,193 | B1* | 12/2019 | Chen | H05K 7/20781 |
| 2008/0285233 | A1 | 11/2008 | Lanus | |
| 2012/0201001 | A1* | 8/2012 | Aoki | H05K 7/20727 361/690 |
| 2012/0201003 | A1* | 8/2012 | Shimasaki | H05K 7/20736 361/695 |
| 2016/0034007 | A1* | 2/2016 | Heiberg | H05K 7/20 361/679.48 |
| 2018/0070475 | A1* | 3/2018 | Ross | H05K 7/20718 |
| 2018/0206360 | A1 | 7/2018 | Dent | |

FOREIGN PATENT DOCUMENTS

| | | |
|---|---|---|
| JP | 521977 A | 1/1993 |
| JP | 08078872 A | 3/1996 |
| JP | 2005268343 A | 9/2005 |
| JP | 2014153562 A | 8/2014 |
| JP | 2018522420 A | 8/2018 |
| WO | 2011045866 A1 | 4/2011 |

OTHER PUBLICATIONS

International Search Report for corresponding PCT Application No. PCT/JP2019/046911, 6 pages, dated Feb. 10, 2020.
International Preliminary Report on Patentability and Written Opinion for corresponding PCT Application No. PCT/JP2019/046911, 16 pages, dated Jun. 10, 2021.

* cited by examiner

ELECTRONIC EQUIPMENT

TECHNICAL FIELD

The present disclosure relates to a technology for improving the cooling performance of electronic equipment.

BACKGROUND ART

In the electronic equipment disclosed in the specification of U.S. Pat. No. 8,228,671, a heat sink is arranged over a microprocessor mounted on a circuit board. A cooling fan is arranged upstream of the heat sink, and a power supply unit is arranged downstream of the heat sink. The air sent from the cooling fan passes first through the heat sink and then through the power supply unit before being discharged to the outside.

SUMMARY

Generally, as the performance of electronic equipment improves, the heat dissipation of its microprocessor and other components increases and so does that of its power supply unit. That means the electronic equipment is required to have ever-higher cooling performance.

The electronic equipment proposed in the present disclosure includes a sheathing member, a cooling target component arranged inside the sheathing member, and multiple cooling fans arranged inside the sheathing member. The cooling target component has a first side and a second side opposite to the first side. The multiple cooling fans are configured to generate airflow passing through the cooling target component either from the first side to the second side or from the second side to the first side. The sheathing member has a first outer surface in a first direction. The cooling target component is arranged obliquely to the first direction and to a second direction perpendicular to the first direction. The sheathing member has a first vent opening formed obliquely to the first and second directions. The first vent opening is arranged along the first side of the cooling target component.

In the electronic equipment, the first vent opening is formed obliquely along the cooling target component. This provides a sufficient area for the first vent opening, which improves the cooling performance of the electronic equipment.

DESCRIPTION OF EMBODIMENTS

The electronic equipment proposed by the present disclosure is described below. In the ensuing description, electronic equipment 10 will be discussed as an example of the electronic equipment proposed by the present disclosure. Incidentally, the structure of the electronic equipment proposed herein may be applied, for example, to game machines, development machines on which to execute various programs (e.g., game programs) under development, and information processing apparatuses (such as server apparatuses) different from the game machines.

Figure 1:
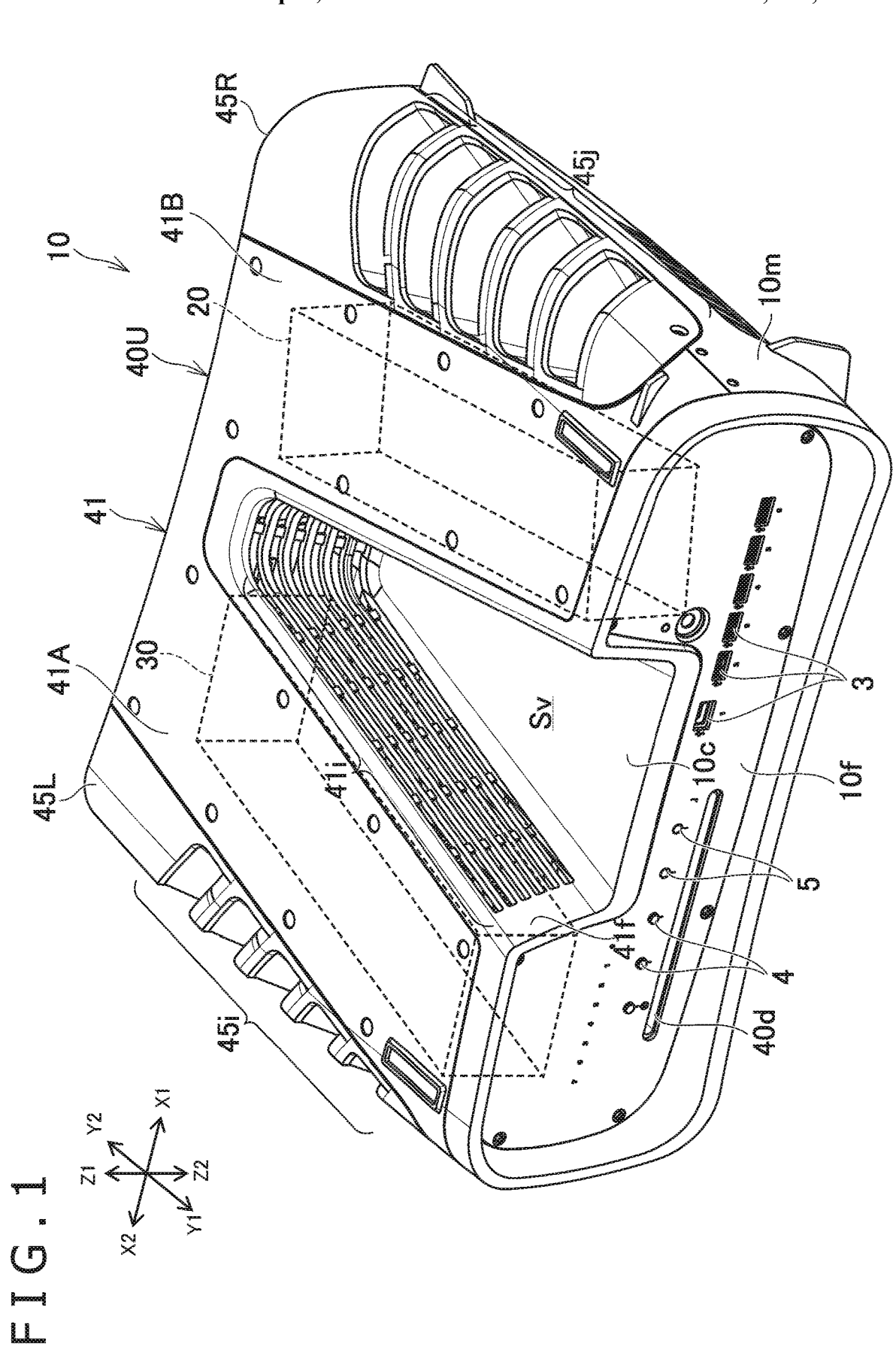
FIG. 1 is a perspective view depicting an example of electronic equipment proposed by the present disclosure.

In the description that follows, the directions indicated by reference signs X1 and X2 in FIG. 1 are referred to as the right direction and left direction, respectively, and the directions denoted by Y1 and Y2 are referred to as the forward direction and backward direction, respectively. The direction represented by Z1 and Z2 are referred to as the upward direction and downward direction, respectively. These directions are used to explain relative positional relations between the constituent elements (components, members, and parts) of the electronic equipment 10 and thus do not specify the attitude of the electronic equipment 10 in use. For example, the electronic equipment 10 may be used in a horizontal attitude as depicted in FIG. 1, or in a vertical attitude. Alternatively, the electronic equipment 10 may be configured to be used in an attitude that reverses the attitude depicted in FIG. 1.

(Overview)

When in use, the electronic equipment 10 is connected with an input device such as a game controller or a keyboard and with a display device, for example. The electronic equipment 10 loads a game program from an optical disk where it is recorded, or by way of a network. The electronic equipment 10 then executes the game program based on signals input from the input device, and causes the display device to display game images resulting from the execution.

Figure 6:
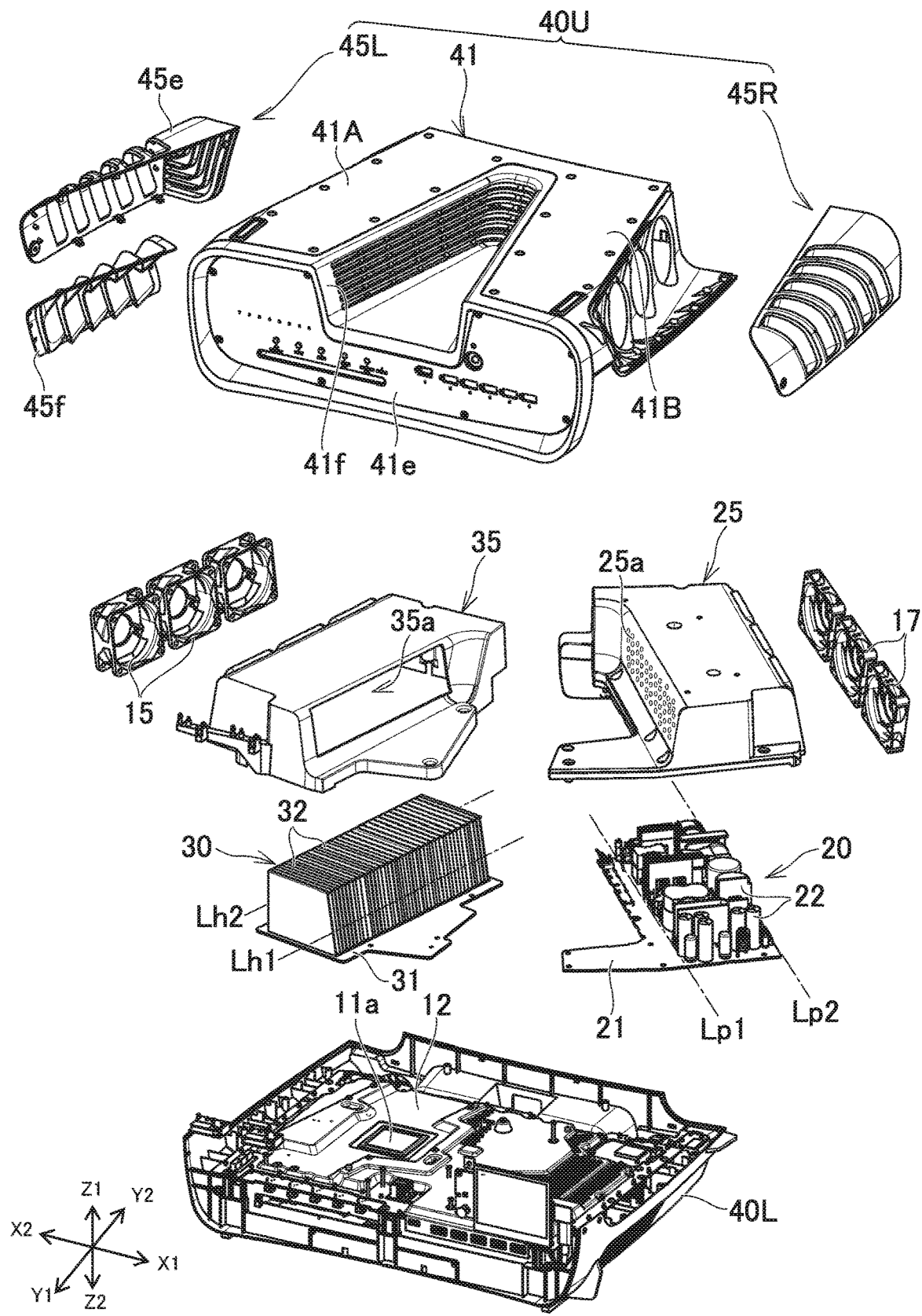
FIG. 6 is an exploded perspective view depicting the example of the electronic equipment.

The electronic equipment 10 has a circuit board 11 (see FIGS. 3 and 4) mounted with integrated circuits such as a CPU (Central Processing Unit), a GPU (Graphics Processing Unit), and a RAM (Random Access Memory). In the example given by the electronic equipment 10, the circuit board 11 is arranged horizontally. That is, the circuit board 11 is arranged in parallel with the longitudinal direction and the crosswise direction. As depicted in FIG. 6, the upper side of the circuit board 11 may be covered by a shield 12 (metal plate) to suppress unnecessary radiation.

As depicted in FIG. 6, the electronic equipment 10 has a heat sink 30. The heat sink 30 is connected with an integrated circuit 11a (see FIG. 6) mounted on the circuit board 11 and acting as a heat source, the heat sink 30 thus drawing heat from the integrated circuit 11a. The electronic equipment 10 has multiple cooling fans 15 (see FIG. 6). The heat sink 30 is cooled by receiving airflow generated by the cooling fans 15. The heat sink 30 is one of the cooling target components described in the appended claims.

In the example given by the electronic equipment 10, the heat sink 30 is arranged on the upper side of the circuit board 11. As depicted in FIG. 6, the heat sink 30 has a plate-like base 31 and multiple fins 32 formed on the base 31. The base 31 is in contact with the integrated circuit 11a. The heat from the integrated circuit 11a is propagated from the base 31 to the fins 32. The shield 12 may have an opening to expose the integrated circuit 11a to permit contact with the heat sink 30.

The base 31 may be constituted by a vapor chamber, for example. That is, the base 31 may be a metal plate in which is formed a space filled with an easy-to-vaporize liquid, for example. Alternatively, the base 31 may be a metal plate that does not have such a space (i.e., metal block). The fins 32 are soldered to the base 31 in a manner arrayed along the circuit board 11.

The structure of the heat sink 30 is not limited to that of the example given by the electronic equipment 10. For example, the base 31 and fins 32 of the heat sink 30 may be integrally formed. The multiple fins 32 may be arrayed in the vertical direction.

As depicted in FIG. 6, the electronic equipment 10 also includes a power supply unit 20. Using the power from a power supply external to the electronic equipment 10, the power supply unit 20 generates and supplies the operating power to the integrated circuit and other components mounted on the circuit board 11. The power supply unit 20 generates heat when in operation. The electronic equipment 10 has multiple cooling fans 17 that generate airflow for cooling the power supply unit 20. The power supply unit 20 is also one of the cooling target components described in the appended claims.

In the example given by the electronic equipment 10, the power supply unit 20 is arranged on the upper side of the circuit board 11 as with the heat sink 30. The power supply unit 20 has a basal plate 21 and multiple electrical components 22 mounted on the basal plate 21. The electrical components 22 include a rectifier diode and a transformer for voltage transformation, for example.

Other constituent elements of the electronic equipment 10 may be arranged on the underside of the circuit board 11. For example, an optical disk drive and a hard disk drive may be arranged under the circuit board 11.

The layout of the components is not limited to that of the example given by the electronic equipment 10. For example, the heat sink 30 and the power supply unit 20 may be arranged on the underside of the circuit board 11 and the other components may be mounted on the upper side thereof. As another example, all components may be arranged on the upper side of the circuit board 11. As a further example, either the heat sink 30 or the power supply unit 20 may be mounted on the upper side of the circuit board 11 and the other component may be arranged on the underside thereof.

(Overview of the Sheathing Member)

The electronic equipment 10 has a sheathing member 40. The above-mentioned circuit board 11, heat sink 30, and power supply unit 20 are arranged inside the sheathing member 40 (see FIG. 1). The electronic equipment 10 is shaped substantially like a rectangular solid. The outer surface constituted by the sheathing member 40 has a front face 10*f* (see FIG. 1) and a back face 10*r* (see FIG. 2) in the crosswise direction, and a right side face 10*m* (see FIG. 1) and a left side face 10*h* (see FIG. 2) in the longitudinal direction. The front face 10*f* and the back face 10*r* may be flat, curved, or uneven. Likewise, the side faces 10*m* and 10*h* may be flat, curved, or uneven. The side faces 10*m* and 10*h* may be perpendicular or oblique to the front face 10*f* and to the back face 10*r*. For example, the electronic equipment 10 may be shaped like a trapezoid or a parallelogram in planar view.

Figure 2:
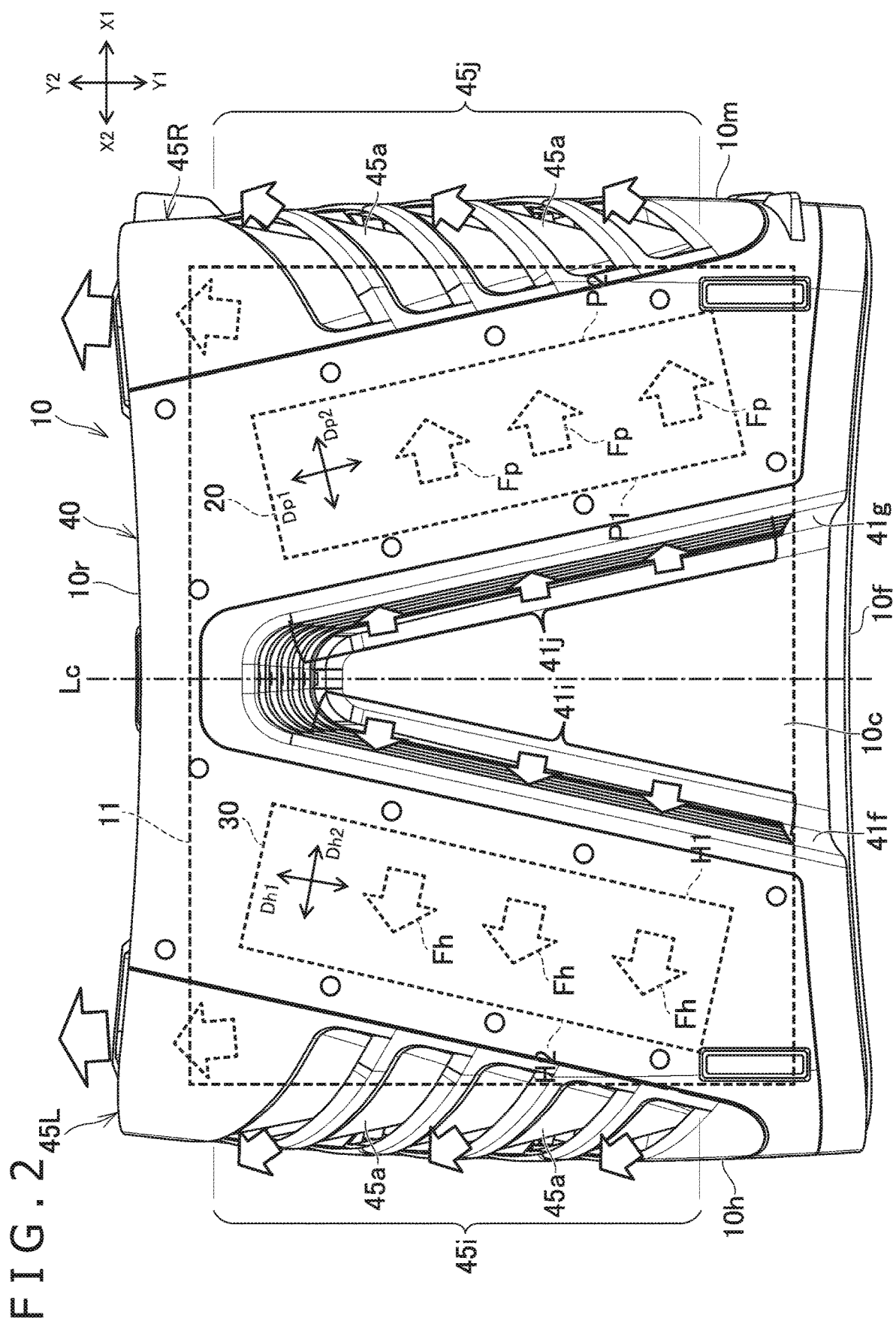
FIG. 2 is a plan view depicting the example of the electronic equipment.
Figure 5:
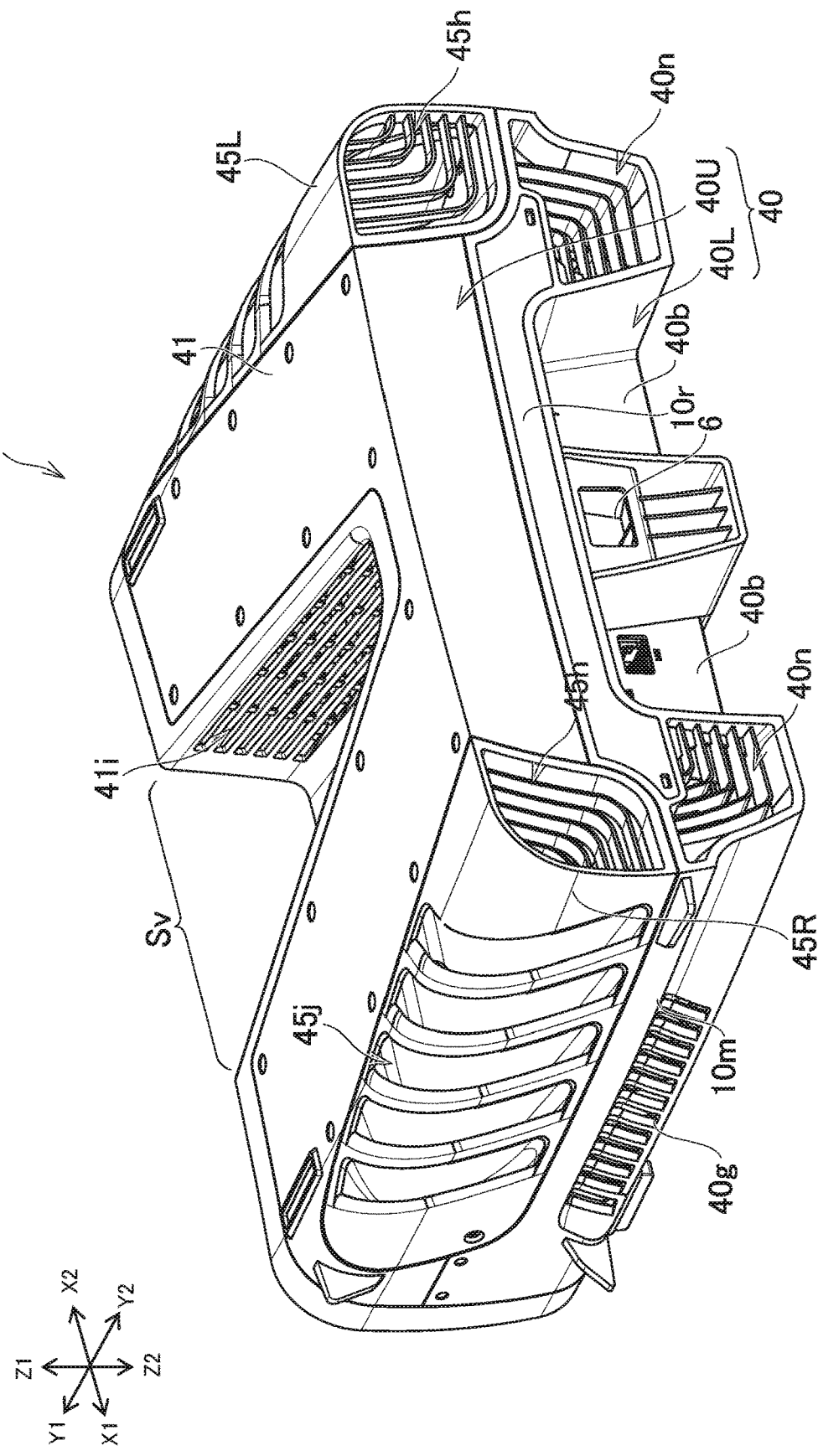
FIG. 5 is a perspective view depicting a back side of the electronic equipment.

In the example given by the electronic equipment 10, as depicted in FIG. 2, the back face 10*r* is slightly curved overall, in such a manner that the right and left portions of the back face 10*r* protrude somewhat backwards. As depicted in FIG. 5, an air outlet opening 45*j* is formed on the right and left sides of the back face 10*r*. The air outlet opening 45*j* will be discussed later. Two recessed portions 40*b* are formed on the underside of the back face 10*r*. Between the two recessed portions 40*b* is a power connector 6, for example. Also, an air outlet opening 40*n* is formed on the right and left sides of the recessed portions 40*b*.

As depicted in FIG. 1, the front face 10*f* is furnished with multiple connectors 3, multiple buttons 4, and multiple light-emitting elements 5, for example. The front face 10*f* may be provided with an insertion opening 40*d* through which to insert an optical disk. The types and numbers of components provided on the front face 10*f* may be varied as needed.

In the example given by the electronic equipment 10, as depicted in FIG. 2, air outlet openings 45*i* and 45*j* equipped with louvers 45*a* are formed on the side faces 10*m* and 10*h*, respectively. The air outlet openings 45*i* and 45*j* will be discussed later in more detail. As depicted in FIG. 5, an air inlet opening 40*g* is formed on the underside of the side faces 10*m* and 10*h*. The air drawn through the air inlet opening 40*g* is discharged from the above-mentioned air outlet opening 40*n* formed on the back face 10*r*. Cooling fans are provided inside the air outlet opening 40*n* to generate such airflow. Alternatively, the electronic equipment 10 may not be equipped with the air inlet opening 40*g* and air outlet opening 40*n*.

In the example given by the electronic equipment 10, as depicted in FIG. 6, the sheathing member 40 has a lower case 40L and an upper case 40U that combine with each other in the vertical direction. The lower case 40L houses the circuit board 11 (see FIG. 4) and the devices and components arranged on the underside thereof. The lower case 40L is shaped like a box that opens upwards. The heat sink 30 and the power supply unit 20 are arranged on the upper side of the circuit board 11 and covered by the upper case 40U. In the example given by the electronic equipment 10, the upper case 40U has a main body cover 41 and side covers 45R and 45L attached to the right and left sides of the main body cover 41.

As depicted in FIG. 5, the upper side portion of the back face 10*r* of the electronic equipment 10 is constituted by a back wall of the upper case 40U, and the underside portion of the back face 10*r* is constituted by a back wall of the lower case 40L. The upper side portion of the side faces 10*m* and 10*h* is constituted by the upper case 40U, and the underside portion of the side faces 10*m* and 10*h* is constituted by the lower case 40L (see FIG. 4). The front face 10*f* is constituted by a wall part 41*e* of the front side of the upper case 40U (see FIG. 6).

The structure of the sheathing member 40 is not limited to that of the example given by the electronic equipment 10. For example, the upper case 40U may not be furnished with the side covers 45R and 45L. In this case, the louvers 45*a* (see FIG. 8), which are formed on the side covers 45R and 45L and will be discussed later, may be formed integrally with the main body cover 41. That is, the upper case 40U may be constituted by a single integrally formed member. Alternatively, the main body cover 41 may be constituted by multiple independently formed members.

(Oblique Arrangement of the Heat Sink and the Power Supply Unit)

The heat sink 30 is arranged obliquely to the crosswise and longitudinal directions of the electronic equipment 10. In the example given by the electronic equipment 10, multiple fins 32 (see FIG. 6) are arrayed obliquely to the crosswise and longitudinal directions of the electronic equipment 10. In other words, the multiple fins 32 are arranged between two straight lines Lh1 and Lh2 (see FIG. 6) that are oblique to both the longitudinal direction and the crosswise direction of the electronic equipment 10. This arrangement permits use of a sufficiently long heat sink 30 (width Wh2 in FIG. 2). Also, each of the fins 32 is positioned obliquely to the crosswise and longitudinal directions of the electronic equipment 10.

Figure 7:
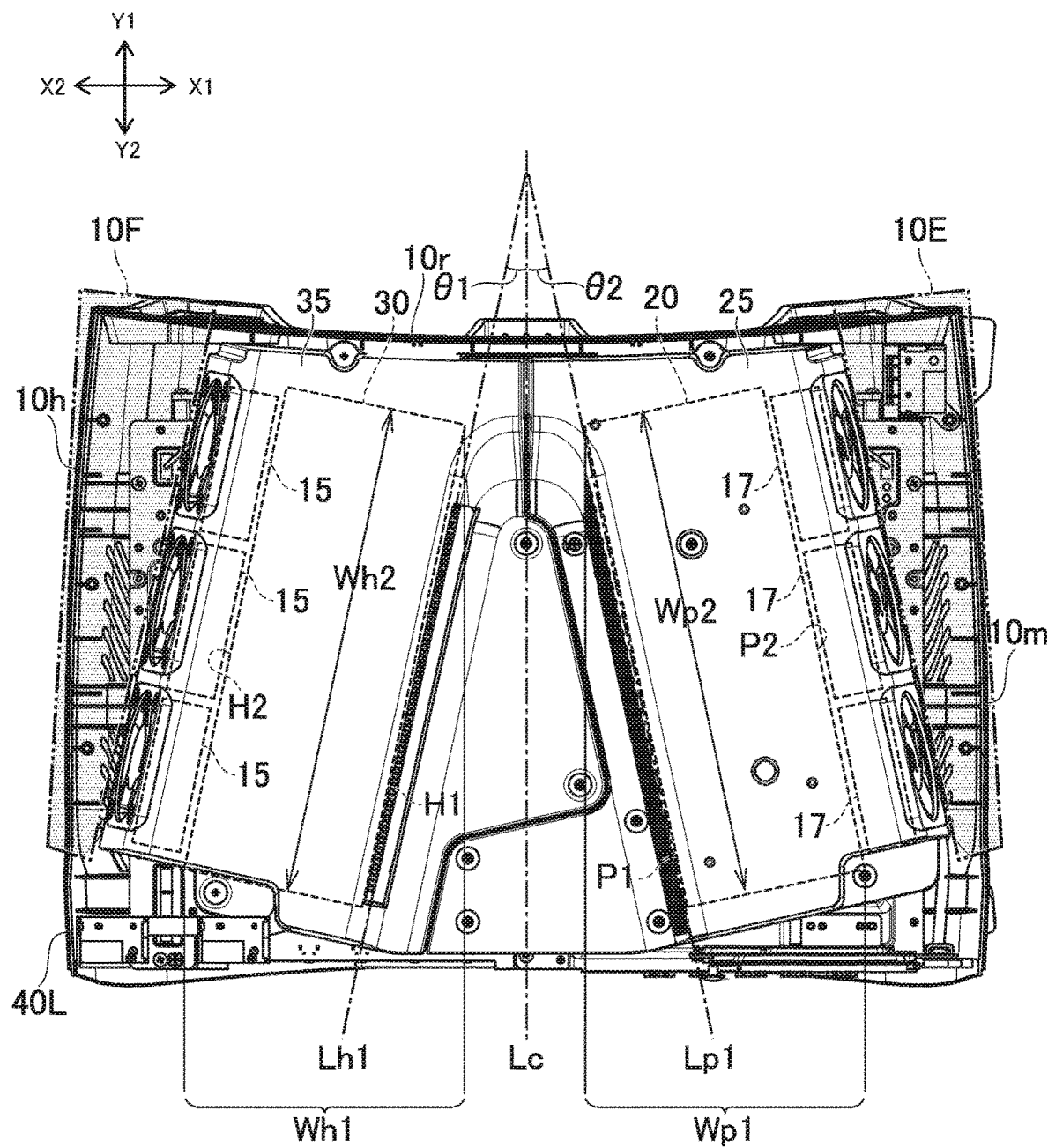
FIG. 7 is a plan view of the electronic equipment with its upper case removed.

In the example given by the electronic equipment 10, as depicted in FIG. 7, an angle θ1 between the straight line Lh1 and a straight line Lc aligned therewith in the longitudinal direction is smaller than 45 degrees. Although the width (length) Wh2 (see FIG. 7) of the heat sink 30 in a longitudinal direction Dh1 (see FIG. 2) is greater than half the total width of the electronic equipment 10 in the crosswise direction, a size Wh1 of the heat sink 30 in the crosswise direction of the electronic equipment 10 is smaller than half the total width of the electronic equipment 10 in the crosswise direction. Thus, when the heat sink 30 is obliquely arranged, the heat sink 30 having the sufficient width (length) Wh2 can be arranged to occupy half the total region of the electronic equipment 10. In the example given by the electronic equipment 10, the heat sink 30 is arranged in a left-half region of the electronic equipment 10.

As with the heat sink 30, the power supply unit 20 is arranged obliquely to the crosswise and longitudinal directions of the electronic equipment 10. In the example given by the electronic equipment 10, the multiple electrical components 22 (see FIG. 6) mounted on the basal plate 21 are arranged obliquely to the crosswise and longitudinal directions of the electronic equipment 10. In other words, the multiple electrical components 22 are arranged between two straight lines Lp1 and Lp2 (see FIG. 6) that are oblique to both the crosswise direction and the longitudinal direction of the electronic equipment 10. This arrangement permits use of a sufficiently sized power supply unit 20.

In the example given by the electronic equipment 10, as depicted in FIG. 7, an angle θ2 between the straight line Lp1 and the straight line Lc aligned therewith in the longitudinal direction is smaller than 45 degrees. Although a width (length) Wp2 (see FIG. 7) of the power supply unit 20 in a longitudinal direction Dp1 (see FIG. 2) is greater than half the total width of the electronic equipment 10 in the crosswise direction, a size Wp1 of the power supply unit 20 in the crosswise direction of the electronic equipment 10 is smaller than half the total width of the electronic equipment 10 in the crosswise direction. Thus, when the power supply unit 20 is obliquely arranged, the power supply unit 20 having a large width (length) Wp2 can be arranged to occupy half the total region of the electronic equipment 10. In the example given by the electronic equipment 10, the power supply unit 20 is arranged to occupy a right-half region of the electronic equipment 10.

In the example given by the electronic equipment 10, the heat sink 30 and the power supply unit 20 are arranged to form an approximate V-shape that opens forward. The heat sink 30 and the power supply unit 20 having the longitudinally extending widths (lengths) Wh2 and Wp2 (see FIG. 7), respectively, are arranged obliquely to each other when housed in the sheathing member 40. The heat sink 30 and the power supply unit 20 may switch their positions with each other. That is, the power supply unit 20 may be arranged in the left-half region of the electronic equipment 10 and the heat sink 30 may be arranged in the right-half region thereof.

(Cooling Structure for the Heat Sink)
(Airflow Path)

As depicted in FIG. 6, multiple cooling fans 15 are arranged inside the sheathing member 40 to generate airflow passing through the heat sink 30. In the example given by the electronic equipment 10, three cooling fans 15 are arrayed along the heat sink 30. More specifically, the three cooling fans 15 are arranged obliquely to the back and on the left of the heat sink 30 and arrayed along the heat sink 30 (i.e., along the fins 32) in a manner oblique to the crosswise and longitudinal directions of the electronic equipment 10. As depicted in FIG. 2, when in operation, the cooling fans 15 generate airflow Fh passing through the heat sink 30 from a first side (obliquely forward right side, H1) to a second side (obliquely backward left side, H2) of the heat sink 30. In the example given by the electronic equipment 10, a triangle-shaped space Sv in planar view (see FIG. 5) is formed at the front of the heat sink 30 and power supply unit 20. Air is drawn from the space Sv to the first side (H1) of the heat sink 30. Thus, in the example of the electronic equipment 10, the first side (H1) is the air inlet side and the second side (H2) is the air outlet side. Here, the "space Sv" refers to a region delimited outside the sheathing member 40 where there are no components or members hampering the airflow. Components or members small enough not to impede the airflow may be arranged in the space Sv.

As depicted in FIG. 2, the sheathing member 40 has an air inlet opening 41i formed along the first side (H1) of the heat sink 30 and obliquely to the longitudinal and crosswise directions of the electronic equipment 10. The air outside the sheathing member 40 is drawn therein through the air inlet opening 41i before being sent to the heat sink 30. Multiple louvers 41a (see FIG. 4) are formed in the air inlet opening 41i. These louvers 41a extend along the heat sink 30 and are arrayed in the vertical direction. The louvers 41a may be formed either to prevent the inside of the air inlet opening 41i from being exposed or to let the inside of the air inlet opening 41i be partially exposed through the adjacent louvers 41a.

Thus, in the example given by the electronic equipment 10, the heat sink 30 is arranged obliquely, and the air inlet opening 41i is formed obliquely along the heat sink 30. This structure ensures that the air inlet opening 41i is sufficiently sized to deal with the heat sink 30. As a result, large quantities of air are sent to the heat sink 30.

Figure 4:
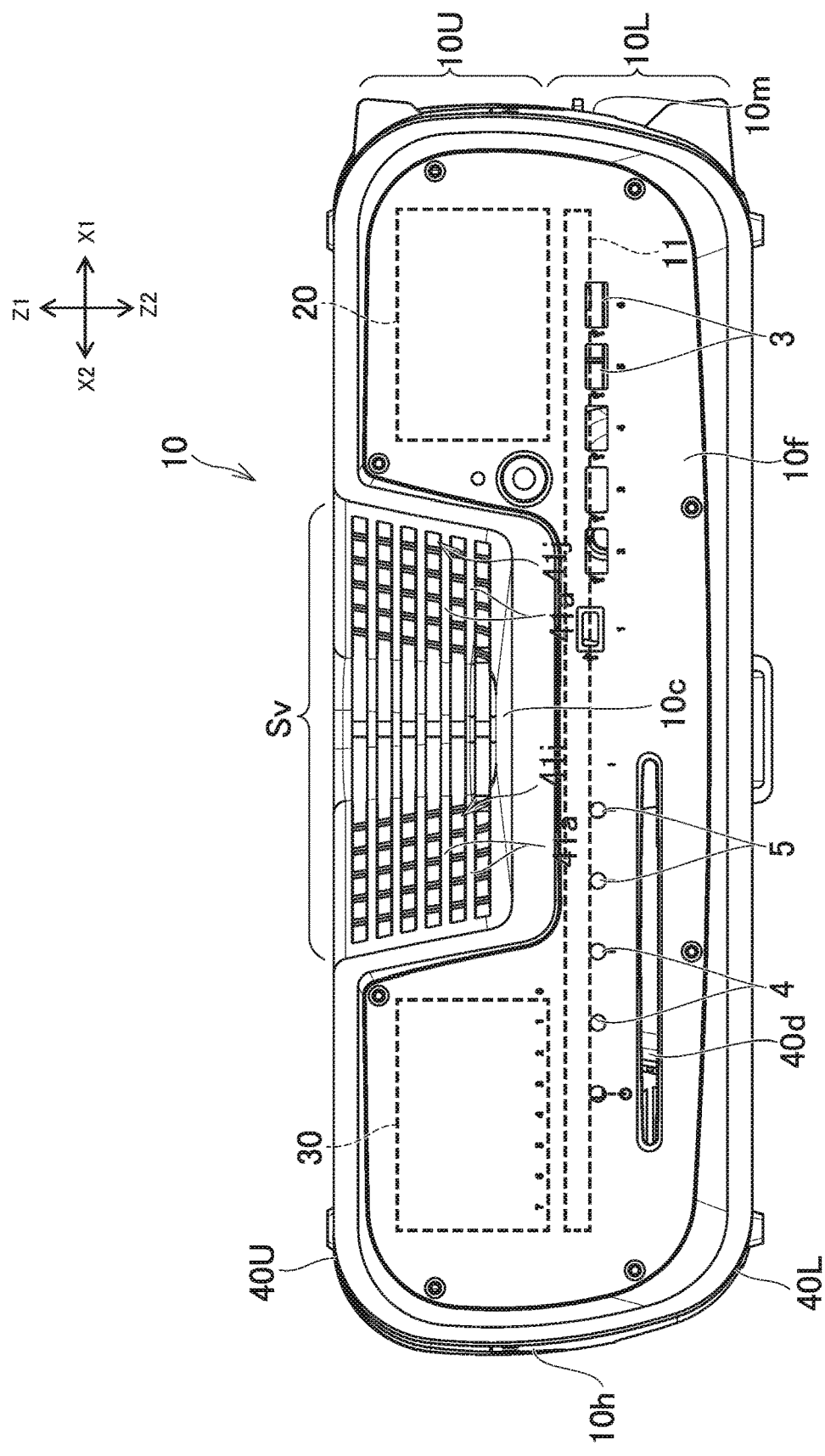
FIG. 4 is a front view depicting the example of the electronic equipment.

As depicted in FIG. 4, the heat sink 30 is arranged on an upper part 10U of the electronic equipment 10. A lower part 10L of the electronic equipment 10 is provided with the circuit board 11, the shield 12 covering the circuit board 11, and various devices (e.g., optical disk drive and hard disk drive) arranged under the circuit board 11, for example. The lower part 10L has a central part 10c (see FIGS. 2 and 4). The central part 10c is positioned, in planar view of the electronic equipment 10, obliquely to the front of the air inlet opening 41i in a direction from the second side (H2) to the first side (H1) of the heat sink 30. The space Sv is formed above the central part 10c. The space Sv is provided obliquely to the front of the air inlet opening 41i. Thus, when the cooling fans 15 are in operation, air is drawn from the air inlet opening 41i through the space Sv into the heat sink 30. The space Sv is opened forward and upward. That is, the electronic equipment 10 has nothing to cover the space Sv at the top and front thereof (e.g., with walls). That means the air inlet opening 41i is exposed forward and upward. This allows air to be drawn smoothly into the heat sink 30 through the air inlet opening 41i.

The heat sink 30 is shaped rectangular in planar view. The width Wh2 (see FIG. 7) of the heat sink 30 in the longitudinal direction Dh1 (see FIG. 2) is greater than the width in a lateral direction Dh2 perpendicular to the longitudinal direction Dh1. Preferably, the width (length) of the air inlet opening 41*i* may correspond to, or be greater than, the width Wh2 of the heat sink 30 in the longitudinal direction Dh1. This provides even airflow throughout the entire heat sink 30.

As depicted in FIG. 6, the sheathing member 40 (i.e., main body cover 41) has a housing part 41A that houses the heat sink 30 and the cooling fans 15. The housing part 41A is shaped like a box that opens downward. The housing part 41A has an inclined wall part 41*f* formed along the first side (H1, FIG. 2) of the heat sink 30. The inclined wall part 41*f* is in parallel with the above-mentioned straight lines Lh1 and Lh2 (see FIG. 7) along which the fins 32 are arrayed. It is in the inclined wall part 41*h* that the air inlet opening 41*i* is formed.

The air inlet opening 41*i* is close to the first side (H1, FIG. 2) of the heat sink 30. There are no other electrical components between the heat sink 30 and the air inlet opening 41*i*. Thus, low-temperature air (i.e., air not heated by other electrical components) drawn through the air inlet opening 41*i* into the sheathing member 40 is sent to the heat sink 30. As a result, the heat sink 30 is effectively cooled. Alternatively, different from the example explained here, the cooling fans 15 may be arranged between the air inlet opening 41*i* and the heat sink 30. In this case, it is preferred that the cooling fans 15 be the only electrical component between the heat sink 30 and the air inlet opening 41*i* and that there be no other electrical components therebetween.

As depicted in FIG. 2, the sheathing member 40 has the air outlet opening 45*i* on the second side (H2) of the heat sink 30. Multiple louvers 45*a* are provided to the air outlet opening 45*i*. The airflow Fh passing through the heat sink 30 is discharged from the air outlet opening 45*i* to the outside of the sheathing member 40.

In the example given by the electronic equipment 10, the air outlet opening 45*i* is also close to the heat sink 30. That is, whereas the cooling fans 15 are arranged between the heat sink 30 and the air outlet opening 45*i*, there are no other electrical components therebetween. This allows the airflow Fh passing through the heat sink 30 to be smoothly discharged from the air outlet opening 45*i* to the outside.

As described above, the air inlet opening 41*i* is formed along the first side (H1) of the heat sink 30, and the air outlet opening 45*i* is formed along the second side (H2) of the heat sink 30. The air inlet opening 41*i* and the air outlet opening 45*i* are positioned opposite to each other across the heat sink 30 in the lateral direction thereof (direction Dh2 in FIG. 2). Between the air inlet opening 41*i* and the air outlet opening 45*i*, only the heat sink 30 exists as the cooling target component. As mentioned above, the heat sink is shaped rectangular in planar view, and its width in the lateral direction Dh2 is less than the width Wh2 in the longitudinal direction Dh1 (see FIG. 7). As a result, the airflow path from the air inlet opening 41*i* to the air outlet opening 45*i* is shortened. This allows the airflow Fh, even at a low pressure, to pass smoothly through the heat sink 30. The air inlet opening 41*i* is formed over the entire width Wh2 of the heat sink 30 in the longitudinal direction Dh1. This makes it possible to supply air to the entire heat sink 30. Alternatively, contrary to the example given by the electronic equipment 10, the cooling fans 15 may be arranged between the heat sink 30 and the air inlet opening 41*i*. In this case, it is preferred that no electrical components be arranged between the heat sink 30 and the air outlet opening 45*i*.

As depicted in FIG. 7, the lower part 10L of the electronic equipment 10 has an overhang part 10F at its left portion. (In FIG. 7, a hatched region represents the overhang part 10F.) The overhang part 10F is positioned obliquely to the back and on the left of the heat sink 30. That is, the overhang part 10F is positioned in a direction from the air inlet side to the air outlet side of the heat sink 30. An airflow path is provided above the overhang part 10F and on the left of the main body cover 41. Thus, an airflow path is formed on the air outlet side of the heat sink 30 (above the overhang part 10F), and an airflow path (space Sv) is also formed on the air inlet side of the heat sink 30. The presence of the overhang part 10F helps reduce exhaust back pressure even in a case where multiple pieces of electronic equipment 10 are arranged in the crosswise direction.

(Left Side Cover)

In the example given by the electronic equipment 10, the upper case 40U has the main body cover 41 and the left side cover 45L formed separate from the main body cover 41 and attached thereto. The air outlet opening 45*i* is formed in the side cover 45L. The side cover 45L is provided to the above-mentioned overhang part 10F.

Figure 3:
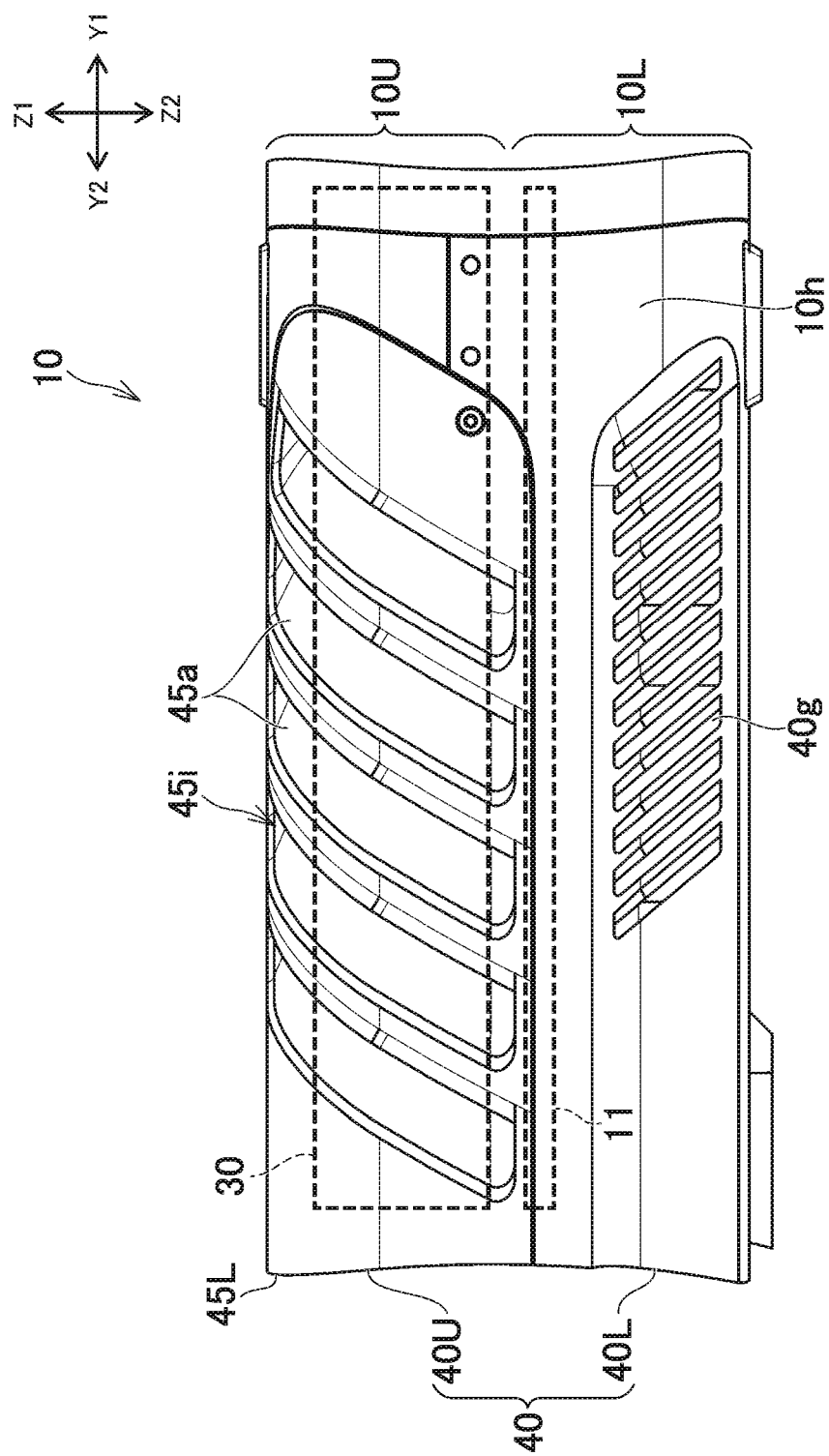
FIG. 3 is a side view depicting the example of the electronic equipment.

As depicted in FIGS. 2 and 3, the side cover 45L is curved, and has a portion constituting the upper side of the electronic equipment 10 and a portion making up the left side face 10*h* thereof. The upper portion of the side cover 45L constitutes the upper side of the electronic equipment 10, and the lower portion of the side cover 45L makes up the upper portion of the left side face 10*h* of the electronic equipment 10. The air outlet opening 45*i* is formed ranging from the upper portion to the lower portion of the side cover 45L. This provides a sufficient opening area for the air outlet opening 45*i*, permitting smooth discharge of the air therethrough.

Figure 8:
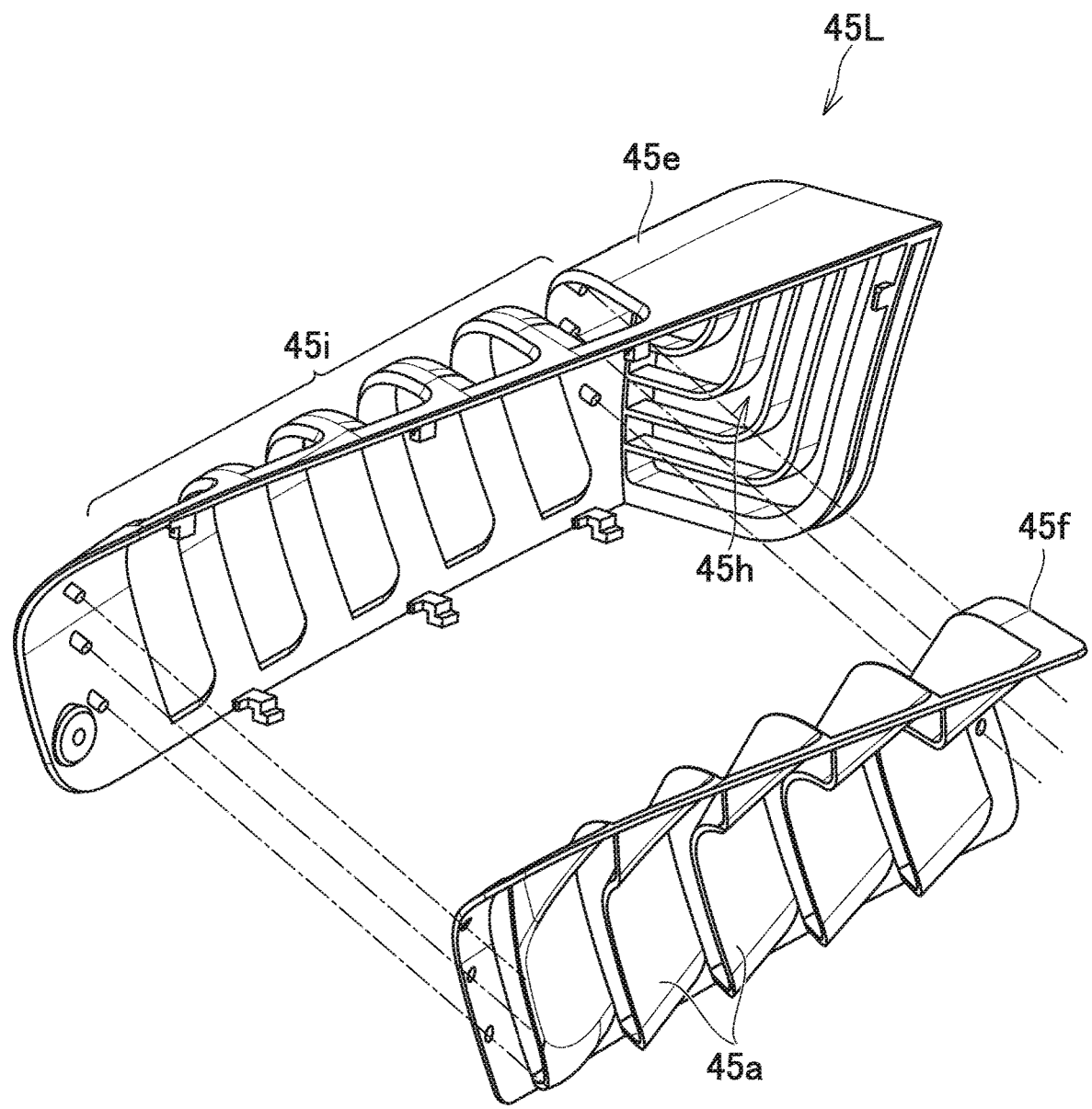
FIG. 8 is a perspective view of a side cover of the electronic equipment.

As depicted in FIG. 8, the air outlet opening 45*i* is equipped with multiple louvers 45*a* arrayed in the longitudinal direction. Each louver 45*a* is shaped like a plate and arranged to guide the airflow in an obliquely backward direction (i.e., backward and to the left). Thus, the air passing through the heat sink 30 is discharged smoothly to the back of the electronic equipment 10.

In the example given by the electronic equipment 10, the side cover 45L is constituted by two members. Specifically, as depicted in FIG. 8, the side cover 45L has an outer member 45*e* making up the upper side and the left side face 10*h* of the electronic equipment 10. The side cover 45L also has an inner member 45*f* that includes the multiple louvers 45*a* and is attached to the inside of the outer member 45*e*. The structure of the side cover 45L is not limited to that of the example given by the electronic equipment 10. Alternatively, the side cover 45L may be integrally formed with a single member.

It is preferred that each louver 45*a* partially overlap with the adjacent louver 45*a* in side view of the electronic equipment 10. This, as depicted in FIG. 3, prevents the interior of the electronic equipment 10 (e.g., cooling fans 15) from being exposed to the outside.

In the example given by the electronic equipment 10, as depicted in FIGS. 5 and 8, the side cover 45L has a back air outlet opening 45*h* forming the back face 10*r* of the electronic equipment 10 in addition to the air outlet opening 45*i*. Thus, the airflow Fh passing through the heat sink 30 may be discharged not only from the above-mentioned air outlet opening 45*i* but also from the back air outlet opening 45*h*. This further reduces the exhaust back pressure. The electronic equipment 10 may alternatively be configured to be set up in a vertical attitude with the left side face 10*h* facing down. In the case where the electronic equipment 10 is placed on the floor with the left side face 10*h* facing downward, the air outlet opening 45*i* is partially closed by the floor but the back air outlet opening 45*h* functions as normally as when the electronic equipment 10 is set up in a horizontal attitude.

The structure of the air outlet opening 45*i* is not limited to that of the example given by the electronic equipment 10. For example, as with the air inlet opening 40*i*, the air outlet opening 45*i* may be formed along the heat sink 30 and obliquely to the longitudinal and crosswise directions of the electronic equipment 10. As another alternative, the air outlet opening 45*i* may be formed integrally with the main body cover 41.

(Arrangement of the Cooling Fans)

In the example given by the electronic equipment 10, as discussed above, three cooling fans 15 are arranged along the heat sink 30. The three cooling fans 15 are placed between the heat sink 30 and the air outlet opening 45*i*. This arrangement of the cooling fans 15 allows the air heated after passing through the heat sink 30 to be discharged unfailingly to the outside of the sheathing member 40.

The cooling fans 15 send air in their rotation axis direction, i.e., they function as axial flow fans. The cooling fans 15 are arranged to face the left side of the electronic equipment 10. The use of axial flow fans makes it easy to send larger quantities of air to the heat sink 30 than, for example, those fans that send air perpendicularly to their rotation axis direction, known as centrifugal fans. Also, using the axial flow fans helps reduce the size of the cooling fans 15 in the direction of airflow (in the direction from the first side H1 to the second side H2 of the heat sink 30).

As depicted in FIG. 7, the total width of the three cooling fans 15 (i.e., width in the longitudinal direction Dh1 of the heat sink 30) corresponds approximately to the width (length) Wh2 of the heat sink 30. Thus, the heat sink 30 as a whole is evenly cooled. The number of the cooling fans 15 is not limited to three. There may be provided two, four, or more cooling fans 15.

As will be discussed later, in the example given by the electronic equipment 10, the power supply unit 20 is also furnished with three cooling fans 17 (see FIG. 6). The number of the cooling fans 15 for the heat sink 30 and the number of the cooling fans 17 for the power supply unit 20 may be different from each other.

(Heat Sink Cover)

As depicted in FIG. 6, the electronic equipment 10 has a heat sink cover 35 arranged inside the sheathing member 40. The heat sink cover 35 is shaped like a box that opens downward. The heat sink cover 35, in a state of housing the heat sink 30, is mounted on the upper side of the shield 12 covering the circuit board 11. The heat sink cover 35 has an opening 35*a* formed to expose the first side (H1, see FIG. 2) of the heat sink 30 in the direction of the air inlet opening 41*i* formed in the main body cover 41. On the opposite side of the opening 35*a*, the heat sink cover 35 has multiple openings that are sized to correspond to the cooling fans 15. The multiple cooling fans 15 may be individually attached to the edges of these openings, for example. An airflow path is determined by the heat sink cover 35 and by the shield 12 (and/or the circuit board 11). Using the heat sink cover 35 allows air to flow only through the heat sink 30 and through nothing else and thereby cools the heat sink 30 efficiently. In a state where the heat sink 30 is housed inside the heat sink cover 35 and where the cooling fans 15 are attached to the heat sink cover 35, these components are covered by the housing part 41A of the main body cover 41.

(Cooling Structure for the Power Supply Unit)

The cooling structure for the power supply unit 20 is approximately symmetrical to the cooling structure for the heat sink 30 relative to a center line Lc in the longitudinal direction of the electronic equipment 10. What follows is a detailed description of the cooling structure for the power supply unit 20.

(Airflow Path)

As depicted in FIG. 6, multiple cooling fans are arranged inside the sheathing member 40 to generate the airflow passing through the power supply unit 20. In the example given by the electronic equipment 10, three cooling fans 17 are arrayed along the power supply unit 20. The three cooling fans 17 are arranged obliquely to the back and on the right of the power supply unit 20. These cooling fans 17 are arrayed along the power supply unit 20 (specifically, along multiple electrical components 22) and obliquely to the longitudinal and crosswise directions of the electronic equipment 10. As depicted in FIG. 2, when in operation, the cooling fans 17 generate airflow Fp passing through the power supply unit 20 in a direction from a first side (P1, obliquely to the front left side) of the power supply unit 20 to a second side (P2, obliquely to the back right side) thereof. In the example of the electronic equipment 10, a triangle-shaped space Sv in planar view is formed at the front of the heat sink 3 and the power supply unit 20. Air is drawn from the space Sv to the first side (P1) of the power supply unit 20. Thus, in the example given by the electronic equipment 10, the first side (P1) is the air inlet side, and the second side (P2) is the air outlet side.

As depicted in FIG. 2, the sheathing member 40 has an air inlet opening 41*j* formed along the first side (P1) of the power supply unit 20 and obliquely to the longitudinal and crosswise directions of the electronic equipment 10. The air outside the sheathing member 40 is drawn therein through the air inlet opening 41*j* before being sent to the power supply unit 20. Multiple louvers 41*a* (see FIG. 4) are formed in the air inlet opening 41*j*. The multiple louvers 41*a* extend along the power supply unit 20 and are arrayed vertically. The louvers 41*a* may be configured either to prevent the inside of the air inlet opening 41*j* from being exposed or to let the inside of the air inlet opening 41*j* be partially exposed through the adjacently formed louvers 41*a*.

In the example given by the electronic equipment 10, as described above, the power supply unit 20 is obliquely arranged, and the air inlet opening 41*j* is also obliquely formed along the power supply unit 20. This structure ensures that the air inlet opening 41*j* is sufficiently sized to deal with the power supply unit 20. As a result, large quantities of air can be sent to the power supply unit 20.

The power supply unit 20 is shaped rectangular in planar view. The width Wp2 of the power supply unit 20 in the longitudinal direction Dp1 is greater than the width in a lateral direction Dp2 perpendicular to the longitudinal direction Dp1 (see FIG. 7). The width of the air inlet opening 41*j* corresponds to the width Wp2 (see FIG. 7) of the power supply unit 20 in the longitudinal direction Dp1. In another example, the width of the air inlet opening 41*j* may preferably be made greater than the width Wp2 of the power supply unit 20. This permits even airflow throughout the entire power supply unit 20.

As depicted in FIG. 4, the power supply unit 20 is arranged on the upper part 10U of the electronic equipment 10. The electronic equipment 10 has the central part 10*c* (see FIGS. 2 and 4). The central part 10*c* is positioned, in planar view of the electronic equipment 10, obliquely to the front of the air inlet opening 41*j* in a direction from the second side (P2, see FIG. 2) to the first side (P1, see FIG. 2) of the power supply unit 20. The space Sv is formed above the central part 10*c*. The space Sv is provided obliquely to the front of the air inlet opening 41j. Thus, when the cooling fans 17 are in operation, air is drawn from the air inlet opening 41j through the space Sv into the power supply unit 20. The space Sv is opened forward and upward as discussed above. That means the air inlet opening 41j is exposed forward and upward. This allows air to be drawn smoothly into the power supply unit 20 through the air inlet opening 41j.

As depicted in FIG. 6, the sheathing member 40 (i.e., main body cover 41) has a housing part 41B that houses the power supply unit 20 and the cooling fans 17. The housing part 41B is shaped like a box that opens downward. The housing part 41B has an inclined wall part 41g formed along the first side (P1, see FIG. 2) of the power supply unit 20. The inclined wall part 41g is in parallel with the above-mentioned straight lines Lp1 and Lp2 (see FIG. 7) along which the multiple electrical components 22 are arrayed. It is in the inclined wall part 41g that the air inlet opening 41j is formed.

The air inlet opening 41j is close to the first side (P1) of the power supply unit 20. There are no other electrical components between the power supply unit 20 and the air inlet opening 41j. Thus, low-temperature air (i.e., air not heated by other electrical components) drawn through the air inlet opening 41j into the sheathing member 40 is sent to the power supply unit 20. As a result, the power supply unit 20 is effectively cooled. Alternatively, different from the example explained here, the cooling fans 17 may be arranged between the air inlet opening 41j and the power supply unit 20. In this case, it is preferred that the cooling fans 17 be the only electrical component between the power supply unit 20 and the air inlet opening 41j and that there be no other electrical components therebetween.

As depicted in FIG. 2, the sheathing member 40 has the air outlet opening 45j on the second side (P2) of the power supply unit 20. Multiple louvers 45a are provided to the air outlet opening 45j. The airflow Fp passing through the power supply unit 20 is discharged from the air outlet opening 45j to the outside of the sheathing member 40.

In the example given by the electronic equipment 10, the air outlet opening 45j is also close to the power supply unit 20. That is, whereas the cooling fans 17 are arranged between the power supply unit 20 and the air outlet opening 45j, there are no other electrical components therebetween. This allows the airflow Fp passing through the power supply unit 20 to be smoothly discharged from the air outlet opening 45j to the outside.

The air inlet opening 41j is thus formed along the first side (P1) of the power supply unit 20, and the air outlet opening 45j is formed along the second side (P2) of the power supply unit 20. The air inlet opening 41j and the air outlet opening 45j are positioned opposite to each other across the power supply unit 20 in the lateral direction thereof (direction Dp2 in FIG. 2). Between the air inlet opening 41j and the air outlet opening 45j, only the power supply unit 20 exists as the cooling target component. As mentioned above, the power supply unit 20 is shaped rectangular in planar view, and its width in the lateral direction Dp2 is less than the width Wp2 in the longitudinal direction Dp1 (see FIG. 7). As a result, the airflow path from the air inlet opening 41j to the air outlet opening 45j is shortened. This allows the airflow Fp, even at a low pressure, to pass smoothly through the power supply unit 20. The air inlet opening 41j is formed over the entire width Wp2 of the power supply unit 20 in the longitudinal direction Dp1 thereof. This makes it possible to supply air to the entire power supply unit 20. Alternatively, contrary to the example given by the electronic equipment 10, the cooling fans 17 may be arranged between the power supply unit 20 and the air inlet opening 41j. In this case, it is preferred that no electrical components be arranged between the heat sink 30 and the air outlet opening 45j.

As depicted in FIG. 7, the lower part 10L of the electronic equipment 10 has an overhang part 10E at its right portion. (In FIG. 7, a hatched region represents the overhang part 10F.) The right-side overhang part 10E is positioned obliquely to the back and on the right of the power supply unit 20. That is, the overhang part 10E is positioned relative to the power supply unit 20 in a direction from the air inlet side to the air outlet side thereof. An airflow path is provided above the overhang part 10E and on the right of the main body cover 41. Thus, an airflow path is formed on the air outlet side of the power supply unit 20 (above the overhang part 10E), and an airflow path (space Sv) is also formed on the air inlet side of the power supply unit 20. The presence of the overhang part 10E helps reduce exhaust back pressure even in a case where multiple pieces of electronic equipment 10 are arrayed in the crosswise direction.

(Right Side Cover)

In the example given by the electronic equipment 10, as depicted in FIG. 6, the upper case 40U has the right side cover 45R formed separate from the main body cover 41 and attached thereto. The air outlet opening 45j is formed in the side cover 45R. The side cover 45R is attached to the overhang part 10E.

As depicted in FIG. 1, the right side cover 45R is curved as with the left side cover 45L, and has a portion constituting the upper side of the electronic equipment 10 and a portion making up the right side face 10m thereof. The upper portion of the side cover 45R constitutes the upper side of the electronic equipment 10, and the lower portion of the side cover 45R makes up the upper portion of the right side face 10m of the electronic equipment 10. The air outlet opening 45j is formed ranging from the upper portion to the lower portion of the side cover 45R. This provides a sufficient opening area for the air outlet opening 45j, permitting smooth discharge of air therethrough.

As with the left side cover 45L depicted in FIG. 8, the air outlet opening 45j of the right side cover 45R is furnished with multiple louvers 45a arrayed in the longitudinal direction. Each louver 45a is shaped like a plate and arranged to guide airflow in an obliquely backward direction (i.e., backward and to the right). Thus, the air passing through the power supply unit 20 is discharged smoothly to the back of the electronic equipment 10.

As with the left side cover 45L, the right side cover 45R is constituted by two members. Specifically, the right side cover 45R has the outer member 45e constituting the upper side and the right side face 10m of the electronic equipment 10. The right side cover 45R also has the inner member 45f including the multiple louvers 45a and is attached to the inside of the outer member 45e. The structure of the right side cover 45R is not limited to that of the example given by the electronic equipment 10. Alternatively, the right side cover 45R may be integrally formed with a single member.

As depicted in FIG. 5, the right side cover 45R has the back air outlet opening 45h forming the back face 10r of the electronic equipment 10 in addition to the air outlet opening 45j. Thus, the airflow Fp passing through the power supply unit 20 may be discharged not only from the above-mentioned air outlet opening 45j but also from the back air outlet opening 45h. This further reduces the exhaust back pressure. The electronic equipment 10 may alternatively be configured to be set up in a vertical attitude with the right side face 10m facing down. In the case where the electronic equipment 10 is placed on the floor with the right side face 10*m* facing downward, the air outlet opening 45*j* is partially closed by the floor but the back air outlet opening 45*h* functions as normally as when the electronic equipment 10 is set up in a horizontal attitude.

The structure of the air outlet opening 45*j* is not limited to that of the example given by the electronic equipment 10. For example, as with the air inlet opening 40*j*, the air outlet opening 45*j* may be formed along the power supply unit 20 and obliquely to the longitudinal and crosswise directions of the electronic equipment 10. Alternatively, the air outlet opening 45*j* may be formed integrally with the main body cover 41.

(Arrangement of the Cooling Fans)

In the example given by the electronic equipment 10, as discussed above, three cooling fans 17 are arranged along the power supply unit 20. The three cooling fans 17 are placed between the power supply unit 20 and the air outlet opening 45*j*. This arrangement of the cooling fans 17 allows the air heated after passing through the power supply unit 20 to be discharged unfailingly to the outside of the sheathing member 40.

As with the cooling fans 15, the cooling fans 17 are axial flow fans. The cooling fans 17 are arranged to face the right side of the electronic equipment 10. The use of axial flow fans makes it easy to send larger quantities of air to the power supply unit 20 than centrifugal fans, for example. Also, using the axial flow fans helps reduce the size of the cooling fans 17 in the direction of airflow (in the direction from the first side P1 to the second side P2 of the power supply unit 20).

As depicted in FIG. 7, the total width of the three cooling fans 17 (i.e., width in the longitudinal direction Dp1 of the power supply unit 20) corresponds approximately to the width (length) Wp2 of the power supply unit 20. Thus, the heat sink 30 as a whole is evenly cooled. The number of the cooling fans 17 is not limited to three. There may be provided two, four, or more cooling fans 17.

(Power Supply Unit Cover)

The electronic equipment 10 has a power supply unit cover 25 arranged inside the sheathing member 40 (see FIG. 6). The power supply unit cover 25 is shaped like a box that opens downward. The power supply unit cover 25, in a state of housing the power supply unit 20, is mounted on the upper side of the shield 12 covering the circuit board 11. The power supply unit cover 25 has a front wall 25*a* facing the air inlet opening 41*j* formed in the main body cover 41. The front wall 25*a* has multiple holes formed therein. This structure allows air drawn from the air inlet opening 41*j* to be sent to the power supply unit 20. Further, the structure prevents reliably the power supply unit 20 from being exposed. On the opposite side of the front wall 25*a*, the power supply unit cover 25 has multiple openings that are sized to correspond to the cooling fans 17. The multiple cooling fans 17 are individually attached to the edges of these openings, for example. An airflow path is determined by the power supply unit cover 25 and by the shield 12 (and/or the circuit board 11). Using the power supply unit cover 25 allows air to flow only through the power supply unit 20 and through nothing else and thereby cools the power supply unit 20 efficiently. In a state where the power supply unit 20 is housed inside the power supply unit cover 25 and where the cooling fans 17 are attached to the power supply unit cover 25, these components are covered by the housing part 41B of the main body cover 41.

(Arrangement of the Two Air Inlet Openings)

As described above, the electronic equipment 10 has the power supply unit 20 and the heat sink 30 as the cooling target components receiving the airflows Fh and Fp generated by the cooling fans 17 and 15. The air inlet opening 41*j* provided for the power supply unit 20 and the air inlet opening 41*i* for the heat sink 30 are arranged to face each other. Here, the expression "two air inlet openings 41*i* and 41*j* face each other" means that the two air inlet openings 41*i* and 41*j* face the straight line Lc (see FIG. 2) passing therebetween in the longitudinal direction. The two air inlet openings 41*i* and 41*j* are inclined to the longitudinal direction, with the distance therebetween gradually increasing toward the front. In the example given by the electronic equipment 10, the angle between the air inlet openings 41*i* and 41*j* is smaller than 90 degrees as depicted in FIG. 2. Alternatively, different from the example given by the electronic equipment 10, the angle between the air inlet openings 41*i* and 41*j* may be larger than 90 degrees.

(Space at the Front of the Air Inlet Openings)

As discussed above, the heat sink 30 and the power supply unit 20 are arranged on the upper part 10U of the electronic equipment 10. As depicted in FIG. 1, the upper part 10U includes two housing parts 41A and 41B (see FIG. 6) that house the heat sink 30 and the power supply unit 20, respectively, the upper part 10U having an approximate V-shape that opens forward. The air inlet opening 41*i* for drawing air to cool the heat sink 30 and the air inlet opening 41*j* for introducing air to cool the power supply unit 20 are formed to face each other, with the space Sv provided therebetween. In other words, there is provided the space Sv common to both the region positioned obliquely to the front of the air inlet opening 41*j* and the region positioned obliquely to the front of the air inlet opening 41*j*. The space Sv is formed adjacent to the air inlet openings 41*i* and 41*j*. The distance between the air inlet opening 41*i* and the air inlet opening 41*j* gradually increases toward the front. Thus, the space Sv is shaped approximately triangular in planar view of the electronic equipment 10 (see FIG. 2).

The lower part 10L is shaped approximately rectangular. In planar view of the electronic equipment 10, the lower part 10L has the central part 10*c* positioned between the two air inlet openings 41*i* and 41*j*. As depicted in FIG. 1, the central part 10*c* is positioned obliquely to the front and on the right of the left-side air inlet opening 41*i*. That is, the central part 10*c* is positioned relative to the left-side air inlet opening 41*i* in a direction from the air outlet side to the air inlet side of the heat sink 30. Also, the central part 10*c* is positioned obliquely to the front and on the left of the right-side air inlet opening 41*j*. That is, the central part 10*c* is positioned relative to the right-side air inlet opening 41*j* in a direction from the air outlet side to the air inlet side of the power supply unit 20. The space Sv is formed above the central part 10*c*. The space Sv is provided obliquely to the front and on the right of the left-side air inlet opening 41*i* and obliquely to the front and on the left of the right-side air inlet opening 41*j*.

As depicted in FIG. 1, the space Sv opens forward and upward, so that the air inlet openings 41*i* and 41*j* are exposed forward and upward through the space Sv. In other words, the electronic equipment 10 has no portion to prevent exposure of the two air inlet openings 41*i* and 41*j* at the front and on top of the space Sv. For example, the sheathing member 40 has no wall part (e.g., louver-equipped wall part) to close the front side of the space Sv. Also, the sheathing member 40 has no wall part (e.g., louver-equipped wall part) to close the upper side of the space Sv. This reduces intake resistance and allows large quantities of air to be supplied to the heat sink 30 and to the power supply unit 20.

(Right-Side and Left-Side Overhangs)

As depicted in FIG. 7, the lower part 10L has the overhang parts 10E and 10F on the right and left sides thereof. The left-side overhang part 10F is positioned obliquely to the back and on the left of the heat sink 30 and the cooling fans 15. In planar view of the electronic equipment 10, the overhang part 10F is positioned relative to the heat sink 30 in a direction from the air inlet side to the air outlet side thereof. The left side face of the overhang part 10F (left side face 10h of the lower part 10L of the electronic equipment 10) is formed in the longitudinal direction. The above-mentioned left side cover 45L is arranged on the upper side of the overhang part 10F and on the left side of the main body cover 41.

The right-side overhang part 10E is positioned obliquely to the back and on the right of the power supply unit 20 and the cooling fans 17. In planar view of the electronic equipment 10, the overhang part 10E is positioned in a direction from the air inlet side to the air outlet side of the power supply unit 20. The right side face of the overhang part 10E (right side face 10m of the lower part 10L of the electronic equipment 10) is formed in the longitudinal direction. The above-mentioned right side cover 45R is arranged on the upper side of the overhang part 10E and on the right side of the main body cover 41.

The presence of the overhang parts 10F and 10E provides airflow paths on the right and left sides of the electronic equipment 10 in a manner reducing exhaust back pressure even in a case where multiple pieces of electronic equipment 10 are arranged in the crosswise direction. As discussed above, the heat sink 30 and the power supply unit 20 are each assured of airflow paths on both the air outlet side and the air inlet side (i.e., airflow path on the air outlet side and space Sv on the air inlet side).

CONCLUSION

As discussed above, the electronic equipment 10 has the sheathing member 40, the heat sink 30 arranged inside the sheathing member 40, and the multiple cooling fans 15 arranged inside the sheathing member 40 to send air to the heat sink 30. The heat sink 30 has the first side (H1, see FIG. 2) and the second side (H2, see FIG. 2). The multiple cooling fans 15 generate the airflow Fh passing through the heat sink 30 from the first side (H1) to the second side (H2) thereof. The heat sink 30 is arranged obliquely to the crosswise and longitudinal directions of the electronic equipment 10. Equipped with the louvers 45a, the air inlet opening 41i of the sheathing member 40 is formed along the first side (H1) of the heat sink 30 and obliquely to the crosswise and longitudinal directions. With the air inlet opening 41i formed obliquely to the heat sink 30, this structure provides the air inlet opening 41i that is sufficiently sized to deal with the heat sink 30. As a result, large quantities of air can be sent to the heat sink 30.

The electronic equipment 10 has the power supply unit 20 arranged inside the sheathing member 40 and the multiple cooling fans 17 arranged inside the sheathing member 40 to send air to the power supply unit 20. The power supply unit 20 has the first side (P1, see FIG. 2) and the second side (P2, see FIG. 2). The multiple cooling fans 17 generate the airflow Fp passing through the power supply unit 20 from the first side (P1) to the second side (P2) thereof. The power supply unit 20 is arranged obliquely to the crosswise and longitudinal directions of the electronic equipment 10. Equipped with the louvers 45a, the air inlet opening 41j of the sheathing member 40 is formed along the first side (P1) of the power supply unit 20 and obliquely to the crosswise and longitudinal directions. With the air inlet opening 41j formed obliquely to the power supply unit 20, this structure provides the air inlet opening 41j that is sufficiently sized to deal with the power supply unit 20. As a result, large quantities of air can be sent to the power supply unit 20.

Alternative Examples

The structure of the electronic equipment proposed by the present disclosure is not limited to that of the example given by the above-described electronic equipment 10.

Figure 9:
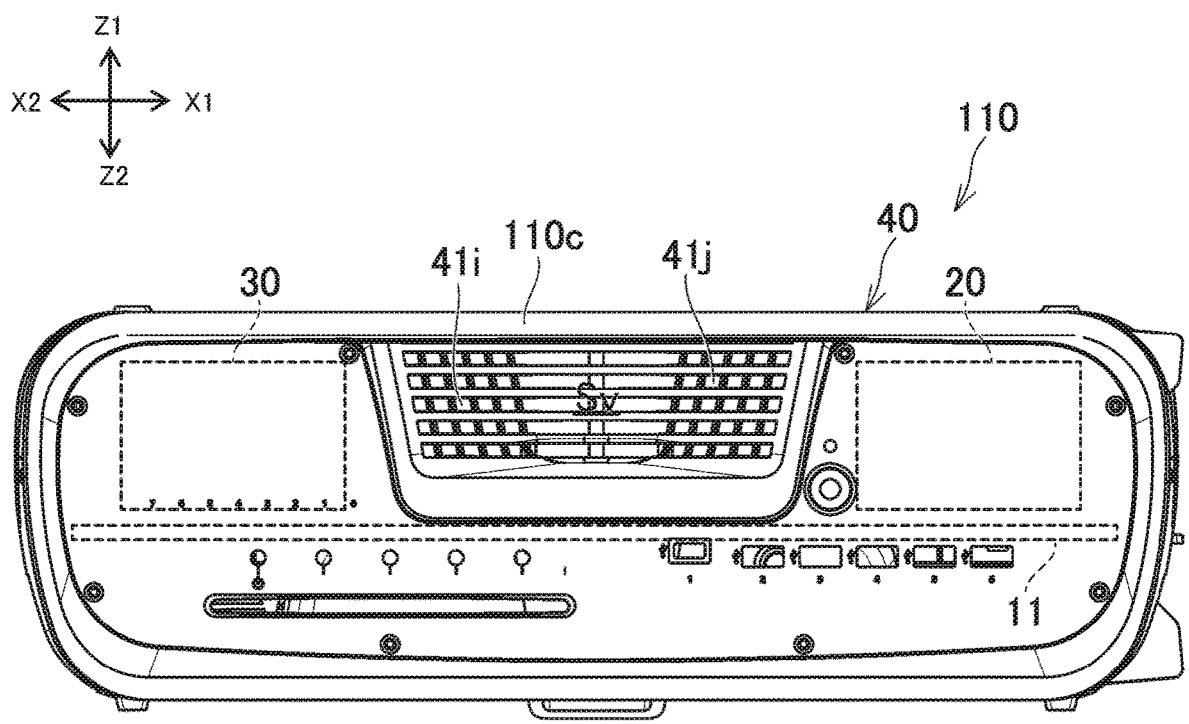
FIG. 9 is a front view depicting another example of electronic equipment proposed by the present disclosure.

For example, in electronic equipment 110 depicted in FIG. 9, the space Sv formed at the front of the air inlet openings 41i and 41j opens forward but does not open upward. That is, the electronic equipment 110 in FIG. 9 has a portion (wall part) 110c above the space SV to provide closure thereof. Air passes through the opening at the front of the space Sv to flow toward the air inlet openings 41i and 41j. There may be louvers provided on the wall part 110c to permit airflow therethrough.

Figure 10:
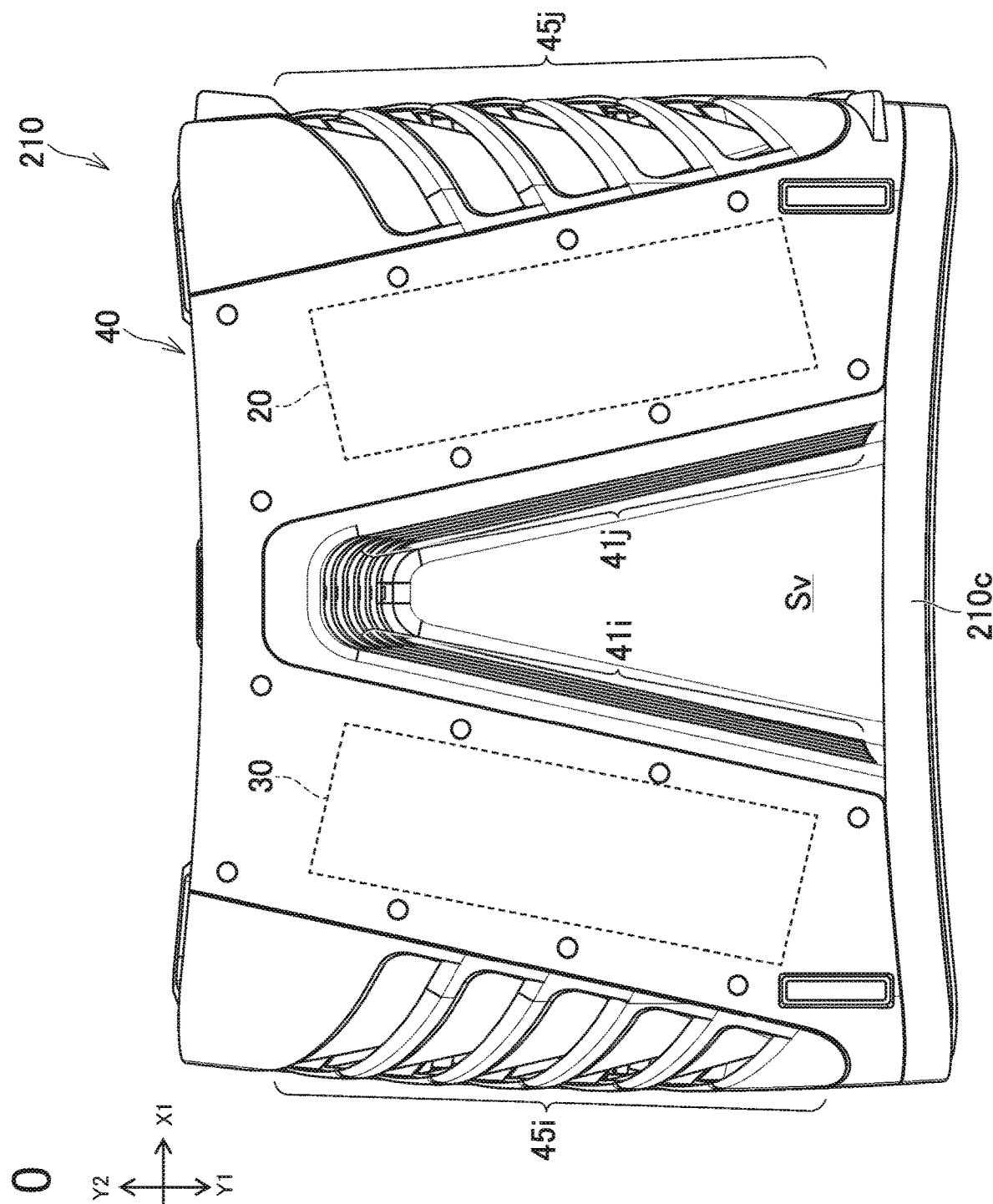
FIG. 10 is a plan view depicting yet another example of electronic equipment proposed by the present disclosure.

In electronic equipment 210 depicted in FIG. 10, the space Sv at the front of the air inlet openings 41j and 41j opens upward but not forward. That is, the electronic equipment 110 in FIG. 9 has a portion (wall part) 210c at the front of the space Sv to provide closure thereof. Air passes through the opening above the space Sv to flow toward the air inlet openings 41i and 41j. There may be louvers provided on the wall part 210c to permit airflow therethrough.

The pieces of electronic equipment 10, 110, and 210 each include the heat sink 30 and the power supply unit 20. The heat sink 30 and the power supply unit 20 are provided with the air inlet openings 41i and 41j, respectively. Alternatively, the pieces of electronic equipment 10, 110, and 210 may each have only either the heat sink 30 or the power supply unit 20. In this case, the sheathing member 40 has only either the air inlet opening 41i or the air inlet opening 41j. As another alternative, the power supply unit 20 may be arranged outside the electronic equipment 10, with only the heat sink 30 provided inside the sheathing member 40. In this case, the sheathing member 40 may have the air inlet opening 41i alone for sending air to the heat sink 30 while dispensing with the air inlet opening 41j.

As a further alternative, the air inlet openings 41i and 41j and the air outlet openings 45i and 45j may be reversed in their positions. That is, the pieces of electronic equipment 10, 110, and 210 may draw in air through the air inlet openings on the right and left sides of the sheathing member 40 and let the drawn air be discharged from the air outlet openings at the positions that would otherwise be occupied by the air inlet openings 41i and 41j.

The invention claimed is:

1. Electronic equipment comprising:
a sheathing member;
a cooling target component arranged inside the sheathing member; and
a plurality of cooling fans arranged inside the sheathing member, wherein:
the cooling target component has a first side and a second side opposite to the first side,
the plurality of cooling fans are configured to generate airflow passing through the cooling target component either from the first side to the second side or from the second side to the first side, the sheathing member has a first outer surface in a first direction, the cooling target component is arranged obliquely to the first direction and to a second direction perpendicular to the first direction, the sheathing member has a first vent opening formed obliquely to the first and second directions, the first vent opening is arranged along the first side of the cooling target component, and if the first direction is a crosswise direction and the second direction is a longitudinal direction, the sheathing member has a second vent opening formed along the second side of the cooling target component, the electronic equipment has an upper part where the cooling target component is arranged, and a lower part, and the lower part has a portion positioned obliquely at a back of the cooling target component in a direction from the first side to the second side.

2. The electronic equipment according to claim 1, wherein the first vent opening and the cooling target component are close to each other.

3. The electronic equipment according to claim 1, wherein no electrical component different from the plurality of cooling fans is arranged between the first vent opening and the cooling target component.

4. The electronic equipment according to claim 1, wherein the sheathing member has a second vent opening formed along the second side of the cooling target component, the second vent opening being equipped with louvers.

5. The electronic equipment according to claim 4, wherein no electrical component different from the plurality of cooling fans is arranged between the second vent opening and the cooling target component.

6. The electronic equipment according to claim 4, wherein the plurality of cooling fans are arranged between one of the first and second vent openings and the cooling target component, no electrical component different from the plurality of cooling fans is arranged between the one of the first and second vent openings and the cooling target component, and no electrical component is arranged between the other of the first and second vent openings and the cooling target component.

7. The electronic equipment according to claim 1, wherein, if the first direction is a crosswise direction and the second direction is a longitudinal direction, the electronic equipment has an upper part where the cooling target component is arranged, and a lower part, the lower part has a portion positioned obliquely at a front of the first vent opening in a direction from the second side to the first side, and a space is provided above the portion of the lower part.

8. The electronic equipment according to claim 7, wherein the space opens forward.

9. The electronic equipment according to claim 8, wherein the electronic equipment has a portion positioned above the space and providing closure of the space.

10. The electronic equipment according to claim 7, wherein the space opens upward.

11. The electronic equipment according to claim 10, wherein the electronic equipment has a portion positioned at a front of the space and providing closure of the space.

12. The electronic equipment according to claim 7, wherein the space opens upward and forward.

13. The electronic equipment according to claim 7, wherein the sheathing member has a second vent opening formed along the second side of the cooling target component, the lower part has a portion positioned obliquely at a back of the second vent opening in a direction from the first side to the second side, and an airflow path is provided above the portion of the lower part.

14. The electronic equipment according to claim 1, further comprising: a heat sink or a power supply unit as the cooling target component.

15. The electronic equipment according to claim 1, wherein the plurality of cooling fans are arranged obliquely to the first and second directions along the first side or the second side of the cooling target component.

16. The electronic equipment according to claim 15, wherein the plurality of cooling fans are arranged along the second side of the cooling target component, and the airflow generated by the plurality of cooling fans passes through the cooling target component from the first side to the second side.

17. The electronic equipment according to claim 1, wherein the cooling target component includes a first cooling target component and a second cooling target component, and each of the first cooling target component and the second cooling target component include a respective first vent opening that face each other.

18. The electronic equipment according to claim 17, wherein the airflow passes through the first cooling target component from the first side to the second side of the first cooling target component, and the airflow passes through the second cooling target component from the first side to the second side of the second cooling target component.

19. The electronic equipment according to claim 17, wherein a space is provided between the first vent opening provided on the first side of the first cooling target component on one hand, and the first vent opening provided on the first side of the second cooling target component on the other hand.

20. The electronic equipment according to claim 19, wherein the electronic equipment has no portion to close the space in the second direction relative to the space.

21. The electronic equipment according to claim 20, wherein the electronic equipment has a portion to close the space in a third direction perpendicular to the first and second directions relative to the space.

22. The electronic equipment according to claim 19, wherein the electronic equipment has no portion to close the space in a third direction perpendicular to the first and second directions relative to the space.

23. The electronic equipment according to claim 22, wherein the electronic equipment has a portion to close the space in the second direction relative to the space.

24. Electronic equipment comprising:
a sheathing member;
a cooling target component arranged inside the sheathing member; and
a plurality of cooling fans arranged inside the sheathing member, wherein:
the cooling target component has a first side and a second side opposite to the first side, the plurality of cooling fans are configured to generate airflow passing through the cooling target component either from the first side to the second side or from the second side to the first side, the sheathing member has a first outer surface in a first direction, the cooling target component is arranged obliquely to the first direction and to a second direction perpendicular to the first direction, the sheathing member has a first vent opening formed obliquely to the first and second directions, the first vent opening is arranged along the first side of the cooling target component, if the first direction is a crosswise direction and the second direction is a longitudinal direction, the electronic equipment has an upper part where the cooling target component is arranged, and a lower part, the lower part has a portion positioned obliquely at a front of the first vent opening in a direction from the second side to the first side, and a space is provided above the portion of the lower part, and at least one of:

(i) the space opens forward, and the electronic equipment has a portion positioned above the space and providing closure of the space, and (ii) the space opens upward, and the electronic equipment has a portion positioned at a front of the space and providing closure of the space.

* * * * *